United States Patent
Kobilka et al.

(10) Patent No.: US 10,593,882 B2
(45) Date of Patent: Mar. 17, 2020

(54) LADDER TETRAZINE POLYMERS

(71) Applicant: International Business Machines Corporation, Armonk, NY (US)

(72) Inventors: Brandon M. Kobilka, Tucson, AZ (US); Jason T. Wertz, Pleasant Valley, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/889,926

(22) Filed: Feb. 6, 2018

(65) Prior Publication Data
US 2018/0159042 A1 Jun. 7, 2018

Related U.S. Application Data

(63) Continuation of application No. 15/177,473, filed on Jun. 9, 2016, now Pat. No. 10,003,026.

(51) Int. Cl.
| | | |
|---|---|---|
| H01L 51/00 | (2006.01) | |
| C08G 61/12 | (2006.01) | |
| H01L 51/42 | (2006.01) | |

(52) U.S. Cl.
CPC ........ *H01L 51/0044* (2013.01); *C08G 61/122* (2013.01); *H01L 51/0035* (2013.01); *H01L 51/0036* (2013.01); *C08G 2261/12* (2013.01); *C08G 2261/1336* (2013.01); *C08G 2261/142* (2013.01); *C08G 2261/144* (2013.01); *C08G 2261/3221* (2013.01); *C08G 2261/3241* (2013.01); *C08G 2261/411* (2013.01); *C08G 2261/72* (2013.01); *C08G 2261/91* (2013.01); *H01L 51/0007* (2013.01); *H01L 51/4253* (2013.01); *Y02E 10/50* (2013.01); *Y02E 10/549* (2013.01)

(58) Field of Classification Search
None
See application file for complete search history.

(56) References Cited

U.S. PATENT DOCUMENTS

| | | |
|---|---|---|
| 5,679,760 A | 10/1997 | Mullen et al. |
| 8,673,183 B2 | 3/2014 | Ding et al. |
| 9,356,240 B1 | 5/2016 | Lai et al. |
| 2009/0184313 A1 | 7/2009 | Buesing et al. |
| 2011/0297925 A1 | 12/2011 | Breuning |
| 2012/0007026 A1 | 1/2012 | Ding et al. |
| 2012/0232238 A1 | 9/2012 | Katz et al. |
| 2017/0260324 A1 | 9/2017 | Fang et al. |
| 2017/0358748 A1 | 12/2017 | Kobilka et al. |
| 2017/0358749 A1 | 12/2017 | Kobilka et al. |

FOREIGN PATENT DOCUMENTS

CN 102329418 B 3/2013

OTHER PUBLICATIONS

Daisuke Izuhara et al., "Bispyridinium-phenylene-based copolymers: low band gap n-type alternating copolymers," J. Mater. Chem, 2011, 3579, www.rsc.org/materials (online), DOI: 10.1039/c0jm02530e, published on Jan. 27, 2011, 6 pages.

(Continued)

*Primary Examiner* — Katie L. Hammer
(74) *Attorney, Agent, or Firm* — Daniel Yeates

(57) ABSTRACT

A ladder tetrazine polymer is disclosed.

17 Claims, 7 Drawing Sheets

(56) References Cited

OTHER PUBLICATIONS

Zhao Li et al., "Development of a New s-Tetrazine-Based Copolymer for Efficient Solar Cells," JACS Communication, J. Am. Chem. Soc. vol. 132, No. 38, 101, American Chemical Society, published on the web Sep. 1, 2010, 2 pages.

Jianfu Ding et al., "The Preparation of 3,6-Bis(3-hevylthien-2-yl)-s-tetrazine and Its Conjugated Polymers," Journal of Polymer Science Part A: Polymer Chemistry DOI 10.1002/POLA, wileyonlinelibrary.com/journal/jpola, published online May 31, 2011, 13 pages.

Daisuke Izuhara et al., "Poly(3-hexylthiophene)-block-poly(pyridinium phenylene)s: Block Polymers of p- and n-Type Semiconductors," American Chemical Society, ACS Publications, Macromolecules 2011, 44, 2678-2684, pubs.acs.org/Macromolecules, dx.doi.org/10/1021/ma102566u, published Mar. 25, 2011, 7 pages.

Daisuke Izuhara et al., "Poly(Pyridinium Phenylene)s: Water Soluble N-Type Polymers," Journal of the American Chemical Society, ja-2009-06513u.R1, PCS Paragon Plus Environment, http://hdl.handle.net/1721.1/74232 (online), accessed Dec. 30, 2015, 17 pages.

Quinton et al., "Triphenylamine/tetrazine based π-conjugated systems as molecular donors for organic solar cells," The Royal Society of Chemistry and the Centre National de la Recherche Scientifique, New Journal of Chemistry 9(12), DOI: 10.1039/C5NJ02097B, published on Oct. 5, 2015, 14 pages.

Schluter, "Ladder Polymers: The New Generation", Advanced Materials, vol. 3, Issue 6, Jun. 1991, pp. 282-291, Verlag GmbH & Co. KGaA, Weinheim.

AUS920160197US3, Appendix P; List of IBM Patent or Applications Treated as Related, Feb. 7, 2018, 2 pages.

List of IBM Patents or Patent Applications Treated As Related, dated Sep. 11, 2019, 2 pages.

Kobilka et al., "Ladder Tetrazine Polymers", U.S. Appl. No. 16/572,694, filed Sep. 17, 2019.

LADDER TETRAZINE POLYMERS

CROSS-REFERENCE TO RELATED APPLICATION

This application is a continuation application of and claims priority from U.S. patent application Ser. No. 15/177,473, filed Jun. 9, 2016.

BACKGROUND

Field of the Invention

The field of the invention is ladder polymers.

Description of Related Art

Renewable energy and materials is a rapidly growing field, the development of which is in higher demand than ever. One major branch of renewable energy is organic electronics and semiconducting materials. Organic semiconductors have several advantages over their silicon-based counterparts including renewability, their ability to be solution-processed into lightweight and flexible films, and their ability to have their properties easily tuned through chemical synthesis.

Important progress has been made towards making organic semiconductor technology ubiquitous in everyday uses. Technologies such as organic photovoltaics (OPVs) and organic batteries may provide a practical path to achieve low-cost, renewable energy harvesting and storage. Plastic polymeric power generation and storage sources offer intriguing opportunities for both portable solar cells and batteries, as such materials are potentially flexible, lightweight, and easy to fabricate through low-cost processing techniques. Further, organic molecules may offer malleable properties that are easy to tune through chemical synthesis.

Functionalized fullerenes, such as phenyl-C61-butryic acid methyl ester (PCBM), have been the most commonly used n-type electron deficient material in the active layer of OPVs. Although alternative n-type materials have been investigated, such alternative materials have not been able to supplant PCBM as the n-type material to blend with p-type conjugated polymers for OPVs. One of the drawbacks associated with PCBM is its weak absorbance in the visible and near-infrared regions of the solar spectrum. Another problem with using PCBM in heterojunction OPVs is the difficulty associated with controlling the morphology of the resulting films. In heterojunction-based OPVs, it is desirable to have interpenetrating regions of the polymer and PCBM for an ordered heterojunction active layer in an OPV device. As PCBM is a small molecule, blending the two materials and spin-casting the materials onto the desired substrate may result in a bulk-heterojunction (BHJ) OPV with "islands" of PCBM (and/or "islands" of p-type material). These "islands" are dead zones for charge-separated holes and electrons as they will not be able to reach the electrodes at either end of the solar cell. Thus, there is a need to create an alternative n-type material to PCBM.

In addition to creating a PCBM alternative, it is desirable to design materials with low band gaps. Low band gap materials based on fused, aromatic organic compounds are important to the development of organic photovoltaics (OPVs) as they can absorb the longer wavelengths of the solar spectrum that smaller aromatic units cannot (such as PCBM). Band gaps can be reduced by increasing the planarity of the conjugated backbone by minimizing various steric interactions between aromatic units. Steric interactions tend to cause backbone twisting that results in a pi-electron conjugation that is only effective over shorter, segmented distances. This distance is affected by the structure of different compounds and inherently varies between different materials. As the conjugation length is increased, the band gap will decrease continually. However, conjugated organic materials will reach a point at which additional conjugated units will no longer result in significant band gap decrease. In this way, increasing conjugation length quickly approaches an asymptotic value for the band gap.

One approach to synthesize highly planar, low band gap materials is by using polymeric systems that are fused through the majority of, if not the entirety of, a conjugated polymer (CP). A CP that is comprised entirely of fused rings is called a ladder polymer. Due to the reasons mentioned above, ladder polymers generally have very low band gaps. Further, an additional benefit of an extended fused ring system is better charge transport due to pi-stacking between adjacent polymer chains. One challenge associated with ladder polymers is poor solubility in organic solvents to remain solution processable.

SUMMARY

According to an embodiment, a ladder tetrazine polymer is disclosed.

According to another embodiment, an organic photovoltaic (OPV) device is disclosed. The OPV device has an active layer than includes a ladder tetrazine polymer.

According to another embodiment, a process of forming a ladder tetrazine polymer is disclosed. The process includes forming a tetrazine-phenylene copolymer from a tetrazine monomer and a phenyl monomer. The process also includes forming a ladder tetrazine polymer from the tetrazine-phenylene copolymer.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

The present disclosure describes ladder tetrazine polymers and methods of forming ladder tetrazine polymers. In a particular embodiment, the ladder tetrazine polymers of the present disclosure may be used as a component of an active layer of an organic photovoltaic (OPV) device. As an example, the ladder tetrazine polymers of the present disclosure may be used as an alternative n-type material to PCBM in the active layer of the OPV device. As another example, the ladder tetrazine polymers of the present disclosure may be an active component of an organic battery.

As described further herein, the ladder tetrazine polymers of the present disclosure may have desirable solubility characteristics, allowing for processing by common polar solvents, such as chloroform, THF, DMF, chlorobenzene, and dichlorobenzone (or non-polar solvents, such as toluene). Further, the high ionic content of the ladder tetrazine polymers of the present disclosure may allow for aqueous processing. Tetrazine moieties allow for four ladder linkages per molecule as well as more imines per repeat unit. The enhanced number of imines allows for a more electron deficient polymer, resulting in a narrower band gap that is ideal for n-type materials.

Figure 1:
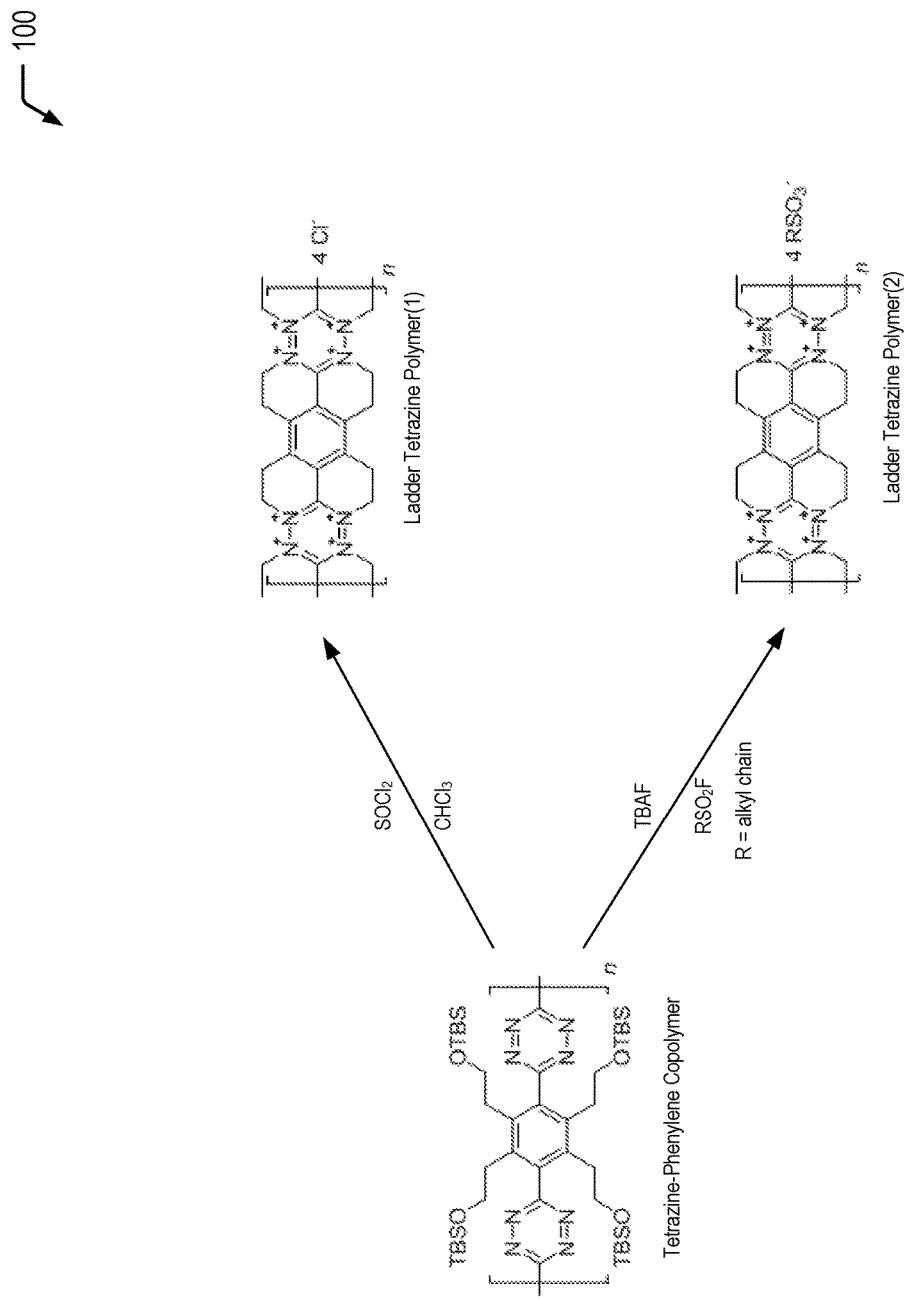
FIG. 1 is a chemical reaction diagram illustrating the formation of ladder tetrazine polymers from a tetrazine-phenylene copolymer, according to one embodiment.

Referring to FIG. 1, a chemical reaction diagram 100 illustrates an example of the formation of ladder tetrazine polymers from a tetrazine-phenylene copolymer, according to an embodiment. In FIG. 1, two example ladder tetrazine polymers are illustrated (identified as "Ladder Tetrazine Polymer(1)" and "Ladder Tetrazine Polymer(2)" in FIG. 1). As illustrated and further described herein with respect to FIG. 2 and FIG. 4, the tetrazine-phenylene copolymer of FIG. 1 may be formed via co-polymerization of a phenyl monomer and a tetrazine monomer via Suzuki cross-coupling conditions.

The first example ladder tetrazine polymer depicted at the top of FIG. 1 may be formed by thionyl chloride-promoted cyclization. As shown in FIG. 1, the TBS-protected hydroxyls are reacted with thionyl chloride which allows the imines of the tetrazine ring to cyclize via intramolecular nucleophilic substitution on the resulting chlorides. The final step creates the ladder tetrazine polymer with four quaternized iminium cations per polymer chain. Not only can this polymer be processed by common polar solvents for organic conjugated polymers (CPs) like chloroform, tetrahydrofuran (THF), and dimethylformamide (DMF), but its high ionic content may allow for aqueous processing.

Prophetic Example: Formation of Ladder Tetrazine Polymer(1)

To a solution of the poly(tetrazine-phenylene) in an organic solvent which may include acetonitrile, chloroform, chlorobenzene, etc. may be added thionyl chloride, and the reaction mixture may be stirred at room temperature for 24 hours. The solvents may be removed in vacuo, and the resulting solid residue may be washed with solvents which may include methanol and DMF.

If difficulty is encountered attempting to dissolve the final polymer in certain organic solvents, a modified ladder polymer forming reaction (shown at the bottom of FIG. 1) can be used that involves tetrabutylammonium fluoride (TBAF) and $RSO_2F$ (where R is an alkyl chain), which results in an ionic polymer with increased solubility (due to the alkyl-functionalized anions). R may be branched or linear alkyl chains (e.g., C1-C20). In the case of branched alkyl chains, a typical branching point may be at either C1 or C2, while other examples such as 3,7-dimethyloctyl chains have alternate branching points.

Prophetic Example: Formation of Ladder Tetrazine Polymer(2)

To a solution of the poly(tetrazine-phenylene) in an organic solvent which may include acetonitrile, chloroform, chlorobenzene, etc. may be added an alkylsulfite fluoride and a 1 M solution of TBAF in THF, and the reaction mixture may be stirred at reflux for 24 hours. The reaction may be cooled to room temperature and may be precipitated into hexane. The precipitate may be collected by filtration or centrifugation and dried. The obtained solid may be purified by any combination of Soxhlet extraction, successive precipitation, or column chromatography.

In a particular embodiment, as described further herein, the ladder tetrazine polymer(s) of FIG. 1 may be used as an n-type component in OPV devices, such as a replacement for fullerenes including PCBM. As another example, the ladder tetrazine polymer(s) of FIG. 1 may be used as the active component in an organic battery. The ability of the ladder tetrazine polymers of FIG. 1 to be processed with organic semiconductor materials in organic solutions as bulk-heterojunction blends as well as in aqueous solutions for orthogonal processing in layered devices is advantageous.

Thus, FIG. 1 illustrates an example of a process of forming ladder tetrazine polymers from a tetrazine-phenylene copolymer. The ladder tetrazine polymers depicted in FIG. 1 have desirable solubility characteristics, allowing for processing by common polar solvents, such as chloroform, THF, DMF, chlorobenzene, and dichlorobenzone. Further, the high ionic content of the ladder tetrazine polymers may allow for aqueous processing. The tetrazine moieties allow for four ladder linkages per molecule as well as more imines per repeat unit, which allows for a more electron deficient polymer, resulting in a narrower band gap that is ideal for n-type materials.

Figure 2:
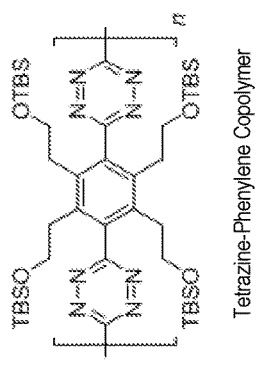
FIG. 2 is a chemical reaction diagram illustrating a process of forming the tetrazine-phenylene copolymer of FIG. 1 from a phenyl monomer and a tetrazine monomer, according to one embodiment.
Figure 2:
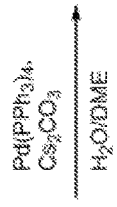
Figure 2:
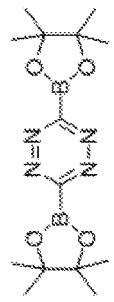
Figure 2:
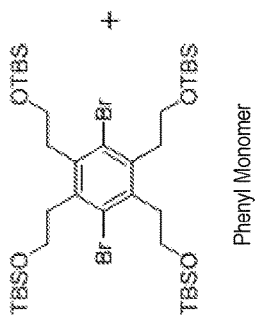

Referring to FIG. 2, a chemical reaction diagram 200 illustrates an example of a process of forming the tetrazine-phenylene copolymer depicted in FIG. 1. FIG. 2 depicts a first example of a phenyl monomer (e.g., a dibrominated phenyl monomer) and a tetrazine monomer (e.g., a tetrazine boronic ester monomer) that may be co-polymerized via Suzuki cross-coupling conditions. As illustrated and further described herein with respect to FIG. 4, alternative phenyl/tetrazine monomers may be used to form the tetrazine-phenylene copolymer. The example phenyl and tetrazine monomers depicted in FIG. 2 may be synthesized according to the reaction schemes illustrated and further described herein with respect to FIG. 3.

The phenyl monomer and tetrazine monomer are polymerized under Suzuki cross-coupling conditions to yield a tetrazine-phenylene copolymer. An illustrative example of Suzuki cross-coupling conditions includes the use of $Pd(PPh_3)_4$ as the Pd catalyst, $Cs_2CO_3$, and water or dimethoxyethane (DME) as a solvent.

Prophetic Example: Formation of Tetrazine-Phenylene Copolymer

A reaction vessel may be charged with the dibromide (1 equiv.), and the diboronic ester (1.05 equiv.), palladium catalyst (1-5 mol %) such as palladium acetate(II) or palladium tetrakis(triphenylphosphine), and a ligand such as tri(o-tolyl)phospine (3-10 mol %). The atmosphere of the reaction vessel may be displaced with an inert gas such as nitrogen or argon. A degassed solvent mixture such dimethyl ether and aqueous solution of an alkaline base such as cesium carbonate (>2 equiv., 2.0 M) may be added to the reaction vessel. A phase transfer agent such as aliquat 336 may be added to the reaction mixture, and the reaction mixture may be stirred at reflux for an extended period of time until the reaction is complete. After the reaction, the polymer may be precipitated by pouring into a solvent such as methanol, acetone, or hexane, and may be filtered. The obtained solid may be purified by any combination of Soxhlet extraction, successive precipitation, or column chromatography.

Thus, FIG. 2 illustrates an example of a process of forming a tetrazine-phenylene copolymer for use in forming the ladder tetrazine polymers of the present disclosure. The tetrazine moieties allow for four ladder linkages per molecule as well as more imines per repeat unit, which allows for a more electron deficient polymer, resulting in a narrower band gap that is ideal for n-type materials.

Figure 3:
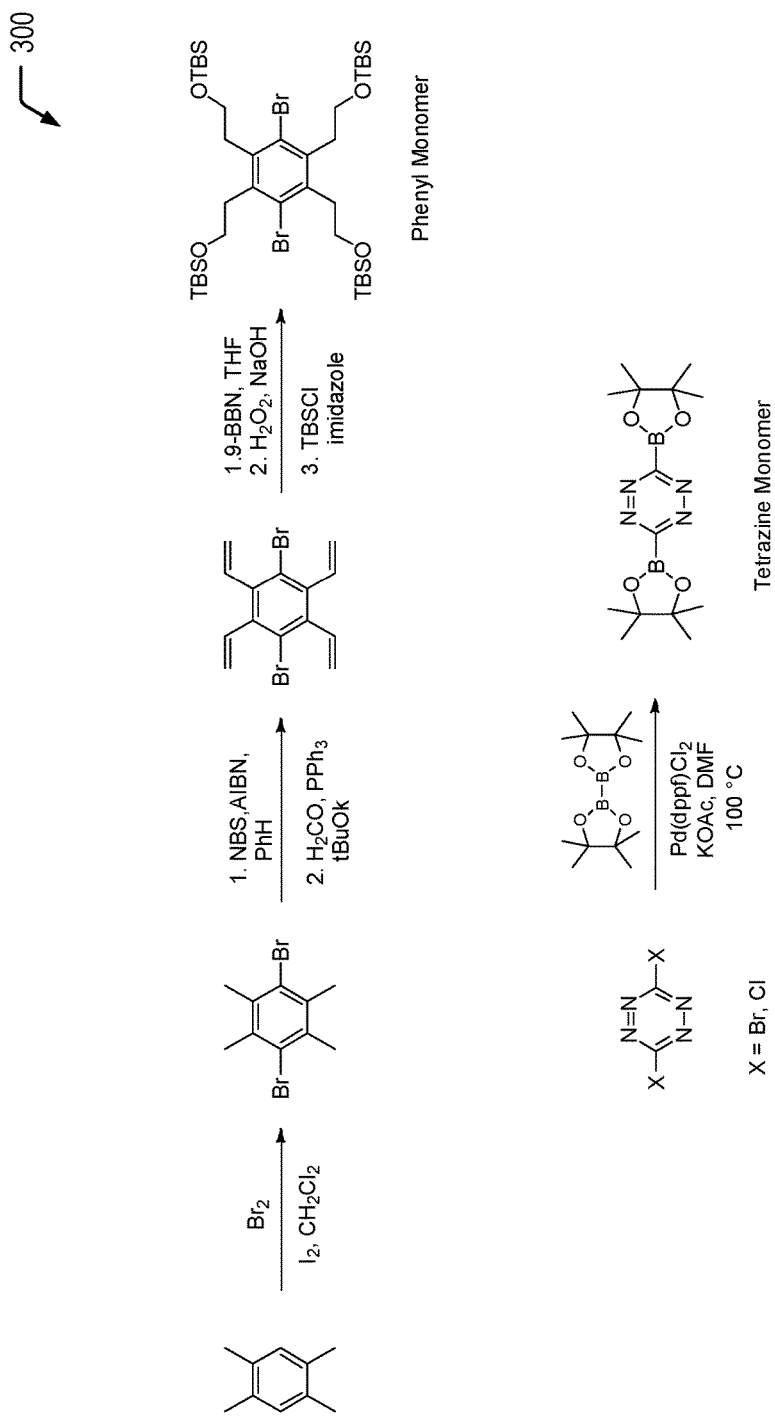
FIG. 3 is a chemical reaction diagram illustrating a process of forming the phenyl monomer and the tetrazine monomer of FIG. 2, according to one embodiment.

Referring to FIG. 3, a chemical reaction diagram 300 illustrates an example of a process of forming the phenyl monomer and the tetrazine monomer depicted in FIG. 2. In the first set of chemical reactions depicted at the top of FIG. 3, the phenyl monomer is synthesized from durene via a number of simple, high-yielding steps, resulting in a final molecule functionalized with para-arylbromides for step-growth polymerization as well as silyl-protected hydroxyl groups which are used to form the ladder tetrazine polymer after copolymerization with a tetrazine monomer. In the second set of chemical reactions depicted at the bottom of FIG. 3, the tetrazine monomer is synthesized by a palladium-catalyzed borolyation reaction of either dichlorotetrazine or dibromotetrazine.

With respect to the phenyl monomer, the first set of chemical reactions illustrates the dibromination of commercially available 1,2,4,5-tetramethyl benzene (also referred to as durene). Next, 1,2,4,5-tetravinylbenzene is synthesized by radical bromination of the four benzyl positions of 1,4-dibromo-2,3,5,6-tetramethylbenzene, followed by Wittig reaction conditions with paraformaldehyde. This is then subjected to hydroboration conditions to make a tetraethanol dibromobenzene. Each hydroxyl group is then protected by tert-butyldimethylsilyl (TBS) protecting groups.

Prophetic Example: Preparation of Phenyl Monomer

Dibromination of 1,2,4,5-tetramethyl benzene (also referred to as durene): The reagent 1,2,4,5-tetramethylbenzene (1.0 equiv.) may be dissolved in dichloromethane. To this stirred solution may be added Iodine (2.0 mol %) followed by a slow dropwise addition of a solution of Bromine (2.6 equiv.) in dichloromethane. After the addition is complete, the resulting solution may be heated to boiling for 1.5 hours. Upon cooling, 5M aq. NaOH may be added to the reaction mixture to neutralize the residual bromine. The product may be collected by filtration, washed with water and dried to furnish 1,4-dibromo-2,3,5,6-tetramethylbenzene.

Synthesis of 1,2,4,5-tetravinylbenzene: 1,4-dibromo-2,3,5,6-tetramethylbenzene (1.0 equiv.), N-Bromosuccinimide (>4.0 equiv.) may be added to a stirred solution of AIBN (0.01-0.02 mol %) in DCM, Chloroform, or carbon tetrachloride at room temperature. The reaction mixture may be heated to reflux and stirred for 5 h, at which time the product has precipitated. The reaction mixture may be allowed to cool to room temperature, and the product may be filtered and washed with cold dichloromethane (5×100 mL). The white solid may be dried under vacuum. The resulting white solid is used in the subsequent reaction without further purification. A solution of the product from the previous step (1.0 equiv.) and triphenylphosphine (2.5 equiv.) in dimethylformamide may be heated at reflux for 18 h. The solvent may be removed, and the residue may be dissolved in tetrahydrofuran, and an excess of paraformaldehyde may be added. Potassium tert-butoxide (3.0 equiv.) in tetrahydrofuran is then transferred in the reaction vessel. The solvent is evaporated, and the residue may be purified on a silica gel column with hexane as the eluent. Removal of solvent and recrystallization from absolute ethanol may also be used.

Synthesis of Phenyl Monomer: 9-BBN (0.5 M in THF, 2.1 equiv.) may be added dropwise over 30 min to a stirred and cooled (0° C.) solution of 1,4-dibromo-2,5-divinylbenzene (8.68 g, 1.0 eqiuv.) in THF (125 mL). The ice bath is removed, and stirring may continue for 10 h. The mixture may be cooled to 0° C. and quenched by dropwise addition of MeOH. Aqueous NaOH (2 M, >1.5 equiv.) and 30% $H_2O_2$ (>10.0 equiv.) may be poured into the stirred mixture. Stirring may continue for 2 h, and the mixture may be extracted with $Et_2O$. The combined organic extracts may be washed with brine, dried ($Na_2SO_4$), and the solvent is evaporated. The crude product may be purified through column chromatography (silica gel, hexane/EtOAc=3/1). The tetrahydroxy product from the previous step (1.0 equiv.) and a catalytic amount of imidazole may be dissolved in an organic solvent such as DCM. Tert-butyldimethylsilyl chloride (>4.0 equiv.) may be added in one portion to the reaction, and the mixture may be stirred at room temperature until completion. The reaction may be washed with water, brine, and the organic layer may be dried over $MgSO_4$. The solvents are removed in vacuo, and the crude product may be purified via recrystallization, column chromatography or by other techniques.

With respect to the tetrazine monomer, the second set of chemical reactions illustrates that the tetrazine monomer is synthesized by borolyation from commercially available 1,2-dichlorotetrazine or 1,2-dibromometrazine (synthesized in one step from commercially available 3,6-dihydrazinyl-1,2,4,5-tetrazine and dibromocyanuric acid).

Prophetic Example: Synthesis of Tetrazine Monomer

To a solution of dibromo or dichlorotetrazine (1.0 eqiuv.) in DMF is added potassium acetate (3.0 equiv.), bis(pinacolato)diboron (>1.5 equiv.), and $PdCl_2dppf$ (5 mol %). The reaction mixture may be stirred at 110° C. until completion. Brine (5 mL) is added and EtOAc (10 mL). The layers are separated, and the organic layer may be dried, filtered, and concentrated in vacuo.

Figure 4:
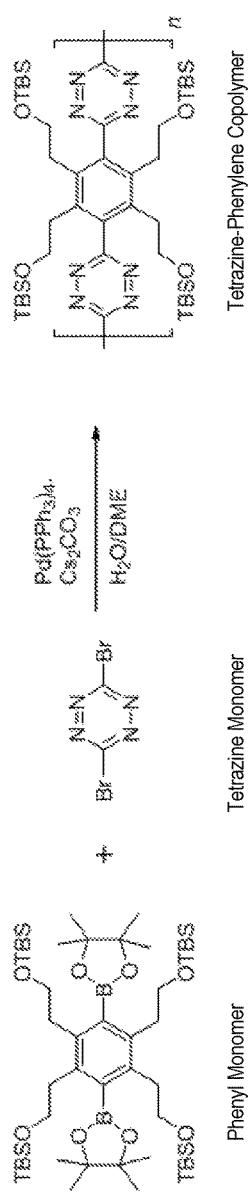
FIG. 4 is a chemical reaction diagram illustrating a process of forming the tetrazine-phenylene copolymer of FIG. 1 from a phenyl monomer and a tetrazine monomer, according to one embodiment.

Referring to FIG. 4, a chemical reaction diagram 400 illustrates an example of a process of forming the tetrazine-phenylene copolymer depicted in FIG. 1. FIG. 4 depicts a second example of a phenyl monomer (e.g., a phenyl boronic ester monomer) and a tetrazine monomer (e.g., a dibrominated tetrazine monomer) that may be co-polymerized. The example phenyl monomer depicted in FIG. 4 may be synthesized according to the reaction scheme illustrated and further described herein with respect to FIG. 5. The tetrazine monomer of FIG. 4 is 1,2-dibromometrazine and may be synthesized in one step from commercially available 3,6-dihydrazinyl-1,2,4,5-tetrazine and dibromocyanuric acid.

The phenyl monomer and tetrazine monomer are polymerized under Suzuki cross-coupling conditions to yield a tetrazine-phenylene copolymer. An illustrative example of Suzuki cross-coupling conditions includes the use of Pd(PPh$_3$)$_4$ as the Pd catalyst, Cs$_2$CO$_3$, and water or DME as a solvent. Similar procedures to those described about with respect to the tetrazine-phenylene copolymer of FIG. 2 may be utilized to form the tetrazine-phenylene copolymer depicted in FIG. 4.

Thus, FIG. 4 illustrates an example of a process of forming a tetrazine-phenylene copolymer for use in forming the ladder tetrazine polymers of the present disclosure. The tetrazine moieties allow for four ladder linkages per molecule as well as more imines per repeat unit, which allows for a more electron deficient polymer, resulting in a narrower band gap that is ideal for n-type materials.

Figure 5:
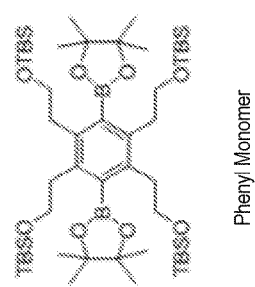
FIG. 5 is a chemical reaction diagram illustrating a process of forming the phenyl monomer of FIG. 4, according to one embodiment.
Figure 5:
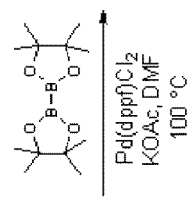
Figure 5:
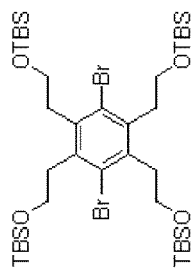

Referring to FIG. 5, a chemical reaction diagram 500 illustrates an example of a process of forming the phenyl monomer depicted in FIG. 4. FIG. 5 illustrates that the phenyl monomer depicted in FIG. 4 may be synthesized by borolyation of the phenyl monomer depicted in FIGS. 2 and 3. Similar reaction conditions to those described above with respect to the synthesis of the tetrazine monomer of FIG. 3 may be utilized to form the phenyl monomer depicted in FIG. 5.

Figure 6:
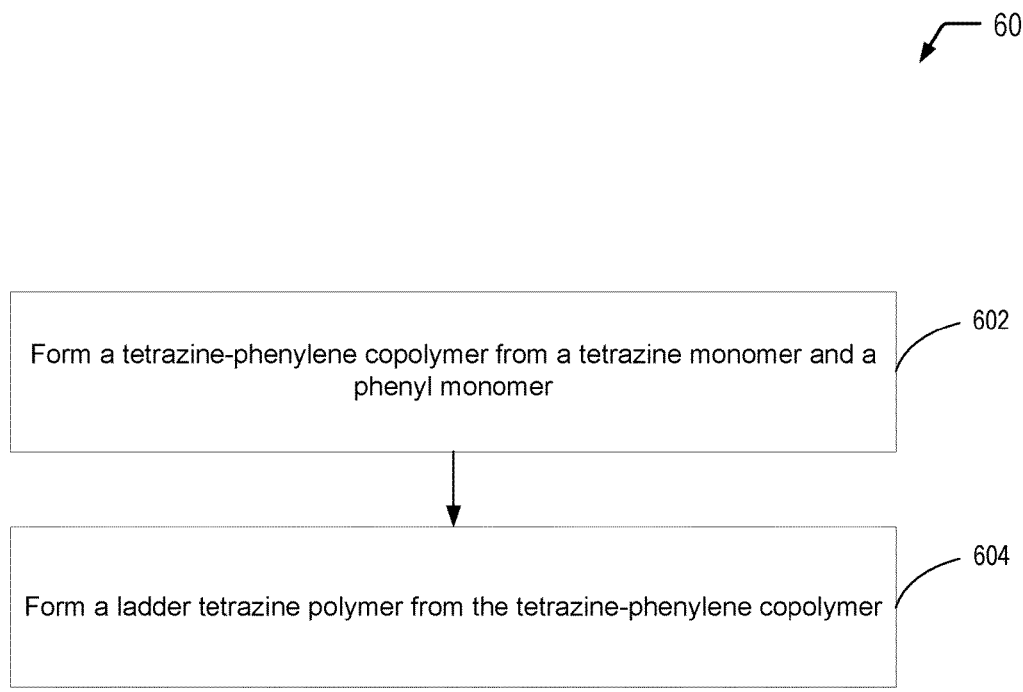
FIG. 6 is a flow diagram showing a particular embodiment of a process of forming a ladder tetrazine polymer from a tetrazine-phenylene copolymer.

Referring to FIG. 6, a flow diagram illustrates an exemplary process 600 of forming a ladder tetrazine polymer, according to a particular embodiment. In FIG. 6, a tetrazine monomer and a phenyl monomer may be used to form a tetrazine-phenylene copolymer, which may be used to form the ladder tetrazine polymer. As illustrated and further described herein with respect to FIG. 7, in some cases, the ladder tetrazine polymer(s) of the present disclosure may be used as an n-type material in an active layer of an OPV device (e.g., as a replacement for a fullerene).

In the particular embodiment illustrated in FIG. 6, operations associated with formation of a tetrazine-phenylene copolymer are identified as 602, while operations associated with formation of a ladder tetrazine polymer are identified as 604. It will be appreciated that the operations shown in FIG. 6 are for illustrative purposes only and that the chemical reactions may be performed in alternative orders, at alternative times, by a single entity or by multiple entities, or a combination thereof. As an example, one entity may produce a tetrazine monomer, and another entity may produce a phenyl monomer, while another entity may form a tetrazine-phenylene copolymer from the tetrazine monomer and the phenyl monomer. Further, alternative or additional entities may perform operations associated with forming a ladder tetrazine polymer from the tetrazine-phenylene copolymer.

The process 600 includes forming a tetrazine-phenylene copolymer from a tetrazine monomer and a phenyl monomer, at 602. For example, the tetrazine-phenylene copolymer may correspond to the tetrazine-phenylene copolymer depicted in FIG. 1, which may be formed from a phenyl monomer and a tetrazine monomer. FIG. 2 illustrates one example of a phenyl monomer and a tetrazine monomer that may be used to form the tetrazine-phenylene copolymer, where the monomers may be formed according to the processes described with respect to FIG. 3. FIG. 4 illustrates another example of a phenyl monomer and a tetrazine monomer that may be used to form the tetrazine-phenylene copolymer, where the phenyl monomer may be formed according to the process described herein with respect to FIG. 5.

The process 600 includes forming a ladder tetrazine polymer from the tetrazine-phenylene copolymer, at 604. For example, referring to FIG. 1, the tetrazine-phenylene copolymer may be used to form the first ladder tetrazine polymer (depicted at the top of FIG. 1) or the second ladder tetrazine polymer (depicted at the bottom of FIG. 1).

Thus, FIG. 6 illustrates an example of a process of forming a ladder tetrazine polymer from a tetrazine-phenylene copolymer. In some cases, the ladder tetrazine polymers of the present disclosure may be used as a component (e.g., an n-type material) of an active layer of an OPV device (as illustrated and further described herein with respect to FIG. 7).

Figure 7:
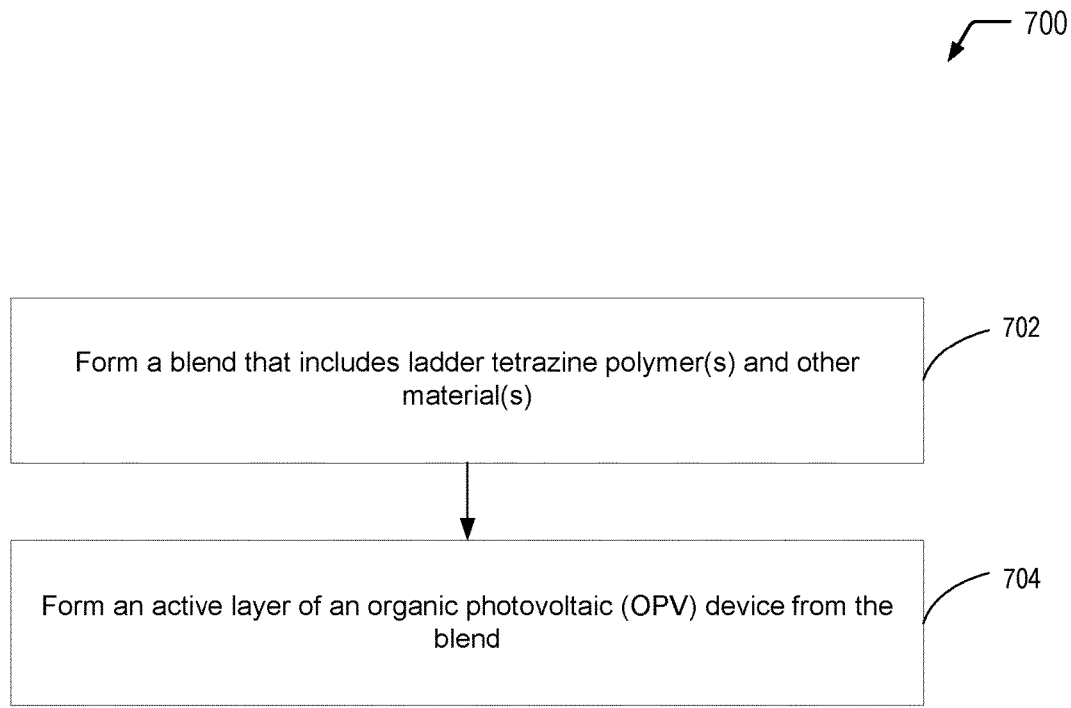
FIG. 7 is a flow diagram showing a particular embodiment of a process of forming an active layer of an organic photovoltaic (OPV) device from a blend that includes a ladder tetrazine polymer.

Referring to FIG. 7, a flow diagram illustrates an exemplary process 700 of forming an active layer of an OPV device from a blend that includes the ladder tetrazine polymer(s) of the present disclosure, according to one embodiment. While FIG. 7 depicts an example in which the ladder tetrazine polymer(s) of the present disclosure are used as a component of an OPV device, it will be appreciated that the ladder tetrazine polymers of the present disclosure may be used in other contexts, such as organic batteries or organic sensors (among other alternatives).

In the particular embodiment illustrated in FIG. 7, operations associated with formation of a blend of materials that includes the ladder tetrazine polymer(s) of the present disclosure are identified as 702, while operations associated with formation of an active layer of an OPV device from the blend are identified as 704. It will be appreciated that the operations shown in FIG. 7 are for illustrative purposes only and that the operations may be performed in alternative orders, at alternative times, by a single entity or by multiple entities, or a combination thereof. As an example, one entity may produce the ladder tetrazine polymer, another entity (or entities) may produce the other material(s) for the blend, while another entity may mix the materials to form the blend. Further, alternative or additional entities may perform operations associated with forming the active layer of the OPV device from the blend.

The process 700 includes forming a blend that includes a ladder tetrazine polymer (or multiple ladder tetrazine polymers) and one or more other materials, at 702. The process 700 also includes forming an active layer of an OPV device from the blend, at 704. For example, the first ladder tetrazine polymer and/or the second ladder tetrazine polymer depicted in FIG. 1 may be mixed with one or more other materials to form a blend. As an example, the ladder tetrazine polymer(s) of the present disclosure may represent an n-type material that may be used to replace PCBM. In this case, the ladder tetrazine polymer(s) may be mixed with one or more p-type materials that are suitable for use in an active layer of an OPV device.

As described further herein, the ladder tetrazine polymers of the present disclosure have desirable solubility characteristics, allowing for processing by common polar solvents, such as chloroform, THF, and DMF. Further, the high ionic content of the ladder tetrazine polymers of the present disclosure may allow for aqueous processing. Tetrazine moieties allow for four ladder linkages per molecule as well as more imines per repeat unit. The enhanced number of imines allows for a more electron deficient polymer, resulting in a narrower band gap that is ideal for n-type materials.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A material comprising alkyl-functionalized anions and a ladder tetrazine polymer comprising iminium cations.

2. The material of claim 1, wherein the ladder tetrazine polymer includes a substituted benzene ring that includes two tetrazine groups arranged in a para-substitution pattern, each tetrazine group including two iminium cations.

3. The material of claim 1, wherein the alkyl-functionalized anions include linear alkyl chains.

4. The material of claim 3, wherein the linear alkyl chains have a chain length in a range of one carbon atom (C1) to twenty carbon atoms (C20).

5. The material of claim 1, wherein the alkyl-functionalized anions include branched alkyl chains.

6. The material of claim 5, wherein the branched alkyl chains have a branching point at a first carbon atom (C1) or at a second carbon atom (C2).

7. The material of claim 5, wherein the branched alkyl chains correspond to 3,7-dimethyloctyl chains.

8. A material comprising chloride anions and a ladder tetrazine polymer comprising iminium cations.

9. The material of claim 8, wherein the ladder tetrazine polymer includes a substituted benzene ring that includes two tetrazine groups arranged in a para-substitution pattern, each tetrazine group including two iminium cations.

10. An organic photovoltaic device comprising an active layer that includes a ladder tetrazine polymer, the ladder tetrazine polymer comprising a substituted benzene ring that includes two tetrazine groups arranged in a para-substitution pattern, each tetrazine group including two iminium cations.

11. The organic photovoltaic device of claim 10, wherein the active layer further includes alkyl-functionalized anions.

12. The organic photovoltaic device of claim 11, wherein the alkyl-functionalized anions include linear alkyl chains.

13. The organic photovoltaic device of claim 12, wherein the linear alkyl chains have a chain length in a range of one carbon atom (C1) to twenty carbon atoms (C20).

14. The organic photovoltaic device of claim 11, wherein the alkyl-functionalized anions include branched alkyl chains.

15. The organic photovoltaic device of claim 14, wherein the branched alkyl chains have a branching point at a first carbon atom (C1) or at a second carbon atom (C2).

16. The organic photovoltaic device of claim 14, wherein the branched alkyl chains correspond to 3,7-dimethyloctyl chains.

17. The organic photovoltaic device of claim 10, wherein the active layer further includes chloride anions.

* * * * *